United States Patent
Kashkoush

(10) Patent No.: US 10,181,405 B2
(45) Date of Patent: Jan. 15, 2019

(54) METHOD FOR SELECTIVE UNDER-ETCHING OF POROUS SILICON

(71) Applicant: Akrion Systems LLC, Allentown, PA (US)

(72) Inventor: Ismail I. Kashkoush, Orefield, PA (US)

(73) Assignee: NAURA AKRION INC.

( * ) Notice: Subject to any disclaimer, the term of this patent is extended or adjusted under 35 U.S.C. 154(b) by 0 days.

(21) Appl. No.: 15/240,451

(22) Filed: Aug. 18, 2016

(65) Prior Publication Data

US 2016/0358785 A1 Dec. 8, 2016

Related U.S. Application Data

(63) Continuation of application No. 14/667,157, filed on Mar. 24, 2015, which is a continuation of application No. 12/716,785, filed on Mar. 3, 2010, now Pat. No. 9,897,032.

(60) Provisional application No. 61/157,195, filed on Mar. 3, 2009.

(51) Int. Cl.
| | |
|---|---|
| *H01L 21/20* | (2006.01) |
| *H01L 31/068* | (2012.01) |
| *H01L 21/306* | (2006.01) |
| *H01L 31/028* | (2006.01) |
| *H01L 31/18* | (2006.01) |
| *H01L 21/311* | (2006.01) |

(52) U.S. Cl.
CPC ...... *H01L 21/30604* (2013.01); *H01L 31/028* (2013.01); *H01L 31/068* (2013.01); *H01L 31/1804* (2013.01); *H01L 31/1892* (2013.01); *H01L 21/31111* (2013.01); *Y02E 10/547* (2013.01); *Y02P 70/521* (2015.11)

(58) Field of Classification Search
CPC . H01L 31/028; H01L 31/068; H01L 31/1804; H01L 31/1892; H01L 21/30604; H01L 21/31111; Y02E 10/547; Y02E 70/521
See application file for complete search history.

(56) References Cited

U.S. PATENT DOCUMENTS

| | | |
|---|---|---|
| 6,194,239 B1 | 2/2001 | Tayanaka |
| 6,326,280 B1 | 12/2001 | Tayanaka |
| 6,331,208 B1 | 12/2001 | Nishida et al. |
| 7,022,585 B2 | 4/2006 | Solanki et al. |
| 7,148,119 B1 | 12/2006 | Sakaguchi et al. |
| 2004/0094510 A1 | 5/2004 | Parent et al. |
| 2005/0191865 A1 | 9/2005 | Jacobson et al. |
| 2006/0276007 A1 | 12/2006 | Nakata et al. |
| 2007/0120229 A1 | 5/2007 | Sakayori et al. |

(Continued)

*Primary Examiner* — Savitr Mulpuri

(74) *Attorney, Agent, or Firm* — The Belles Group, P.C.

(57) ABSTRACT

A method for making a solar cell is disclosed. In accordance with the method of the present invention a composite wafer is formed. The composite layer includes a single crystal silicon wafer, a silicon-based device layer and sacrificial porous silicon sandwiched therebetween. The composite wafer is treated to an aqueous etchant maintained below ambient temperatures to selectively etch the sacrificial porous silicon and release or undercut the silicon-based layer from the single crystal silicon wafer. The released silicon device layer is attached to a substrate to make a solar cell and the released single crystal silicon wafer is reused to make additional silicon device layer.

12 Claims, 2 Drawing Sheets

(56) References Cited

U.S. PATENT DOCUMENTS

2008/0001243 A1    1/2008   Otake et al.
2009/0042320 A1    2/2009   Wang et al.

METHOD FOR SELECTIVE UNDER-ETCHING OF POROUS SILICON

CROSS-REFERENCE TO RELATED APPLICATION

The present application is a continuation of U.S. patent application Ser. No. 14/667,157 filed Mar. 24, 2015, which is a continuation of U.S. patent application Ser. No. 12/716,785, filed Mar. 3, 2010 (now U.S. Pat. No. 8,987,032), which claims priority under 35 U.S.C. § 119(e) to U.S. Provisional Patent Application Ser. No. 61/157,195, filed on Mar. 3, 2009, and titled "METHOD FOR SELECTIVE UNDER-ETCHING OF POROUS SILICON," the entireties of which is hereby incorporated by reference.

FIELD OF THE INVENTION

This invention relates to a method for making solar cells. More particularly, the present invention relates to selective etching of a porous silicon layer to under-cut and release a silicon-based device layer that is then used for making solar cells.

BACKGROUND OF THE INVENTION

Solar cells are semiconductor devices that are usually manufactured from silicon-based material. Some solar cells are made from screen printed poly-crystalline silicon. Single crystalline wafers can be used to make very efficient solar cells. However, high manufacturing costs for making single crystalline materials makes the large scale production of solar cells from these materials impractical.

Poly-crystalline silicon wafers used to manufacture solar cells are made by cutting 180 to 350 micrometer thick wafers from block-cast silicon ingots. The wafers are usually lightly p-type doped. To make a solar cell from the wafer, a surface diffusion of n-type dopants is performed on the front side of the wafer. This forms a p-n junction a few hundred nanometers below the surface. Solar cells usually also include anti-reflective coatings, such as silicon nitride or titanium dioxide and/or have textured surfaces increase efficiency of light absorption. This method is disadvantageous in that the crystal takes an exceptionally long time to grow on the silicon ingot.

Metal contacts are formed on the back and front surfaces of poly-crystalline silicon wafers by screen-printing metal pastes, such as silver paste or aluminum paste. After the metal contacts are formed, the solar cells are assembled into panels and are sandwiched between glass and polymer resins.

As mentioned above, solar cells and solar panels that are formed from single crystal silicon are preferred because of the efficiency of the solar cells and panels made from single crystal silicon.

SUMMARY OF THE INVENTION

The present invention is direct to a method of selectively etching a silicon wafer, the method comprising: a) providing a sacrificial porous silicon layer on a single crystal silicon wafer; and b) selectively etching the sacrificial porous silicon layer with an aqueous etchant; wherein the aqueous etchant is maintained at a temperature in a range of 0° C. to 10° C. during step b) and the aqueous etchant comprises one or more of potassium hydroxide, sodium hydroxide and hydrogen fluoride in a concentration ranging from a non-zero amount up to 5 wt. % based on the total weight of the aqueous etchant.

The silicon-based device layer is preferably crystalline or semi-crystalline, as opposed to being amorphous, and is epitaxially grown on top of the sacrificial porous silicon layer. The silicon-based device layer is preferably a p-doped silicon-based device layer that has a thickness of several microns to several hundred microns. The silicon-based device layer is formed using any suitable growth or deposition technique, such as chemical vapor deposition. A working wafer that includes the single crystal silicon wafer, the silicon-based device layer and the sacrificial porous silicon layer sandwiched between the single crystal silicon wafer and the silicon-based device layer is referred to herein as a composited wafer.

In accordance with the embodiments of the invention, after the composite wafer is formed the sacrificial layer is selectively etched thereby releasing the silicon-based device layer, or a portion thereof and the single crystal wafer, or a portion thereof. The released silicon-based device layer, or the portion thereof, is then provided with the appropriate electrical contacts and anti-reflective coatings and is coupled to one or more substrates to form a solar cell. The released single crystal wafer, or the portion thereof, is then used to make additional composite wafers and additional solar cells, such as described above.

In order to accomplish release of the silicon-based device layer, or the portion thereof, the etch rate of the porous silicon layer needs to be significantly faster than the etch rates of either the single crystal wafer or of the silicon-based device layer. Selective etching of the sacrificial porous silicon layer has been observed by treating the composite wafer to an aqueous etchant that is maintained at temperatures in a range of 0 to 10 degrees Celsius. The aqueous etchant preferably includes one or more etchants such as potassium hydroxide, sodium hydroxide and hydrogen fluoride in a concentration of 5% or less by weight. In further embodiments of the invention the aqueous etchant includes an alcohol, such as isopropyl alcohol, in a concentration of 10% or less by weight. In still further embodiments of the invention the etchant includes a surfactant in a concentration of 1% or less by weight. Also, to further control etch rates during the selective etching step, the composite wafer and the aqueous etchant are treated with ultrasonic energy.

DETAILED DESCRIPTION OF THE INVENTION

Figure 1A:
FIG. 1A shows a composite wafer used to make a silicon-based device layer for solar cells, in accordance with the embodiments of the invention.

FIG. 1 shows a composite wafer 100 used to make a silicon-based device layer used in solar cells. The composite wafer 100 includes a single crystal silicon wafer 101 and a sacrificial porous silicon layer 103 that is deposited thereon, which is referred to herein as a base wafer. The composite wafer 100 also includes a silicon-based device layer 105 that is preferably crystalline or semi-crystalline and is epitaxially grown on top of the sacrificial porous silicon layer 103.

As described above, the sacrificial porous silicon layer 103 preferably has a porosity of 30 percent or more and is several nanometers to several microns thick. The sacrificial porous silicon layer 103 is formed from any suitable porous silicon material including, but not limited to carbon doped oxide, spin-on-glass (SOG), fluoridated silicon glass (FSG) or a combination thereof.

The silicon-based device layer 105 is preferably a p-doped silicon-based device layer that has a thickness of several microns to several hundred microns. The sacrificial porous silicon layer 103 and the silicon-based device layer 105 are formed using any suitable coating, growth and/or deposition techniques including, but not limited to, thermal deposition and chemical vapor deposition.

Figure 1B:
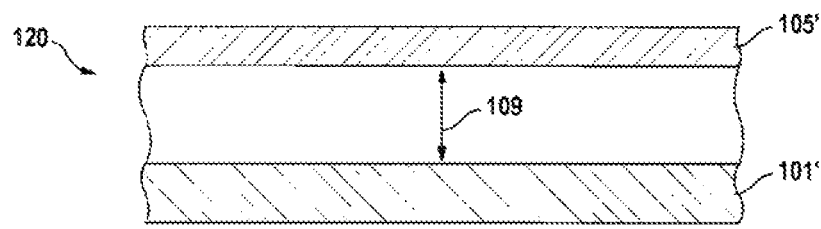
FIG. 1B illustrates releasing a silicon-based device layer from the composite wafer, in accordance with the embodiments of the invention.
Figure 1C:
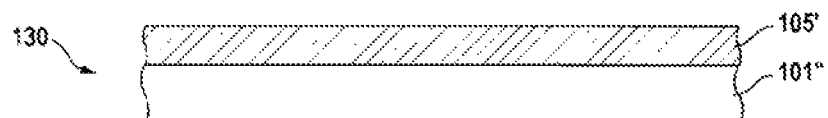
FIG. 1C shows a released silicon-based device layer coupled to a substrate to form a solar cell, in accordance with the embodiments of the invention.

FIG. 1B illustrates a schematic representation 120 of a released silicon-based device layer 105' and a released single crystal silicon wafer 101' which are formed by selectively etching the sacrificial porous silicon layer 103, as indicated by the arrow 109. Selective etching of the sacrificial porous silicon layer 103 is preferably accomplished by steps outlined and described below with reference to FIGS. 2A-C FIG. 1C shows the released silicon-based device layer 105' coupled to a new substrate 101" to form a solar cell 130. Prior to coupling the released silicon-based device layer 105' to the new substrate 101", the released silicon-based device layer 105' and/or substrate 101" are preferably provided with the appropriate electrical contacts and anti-reflecting coatings to form a working solar cell 130. The released single crystal silicon wafer 101' is reused preferably from 0-50 times, and more preferably from 20-30 times to make additional composite wafers and solar cells.

Figure 2A:
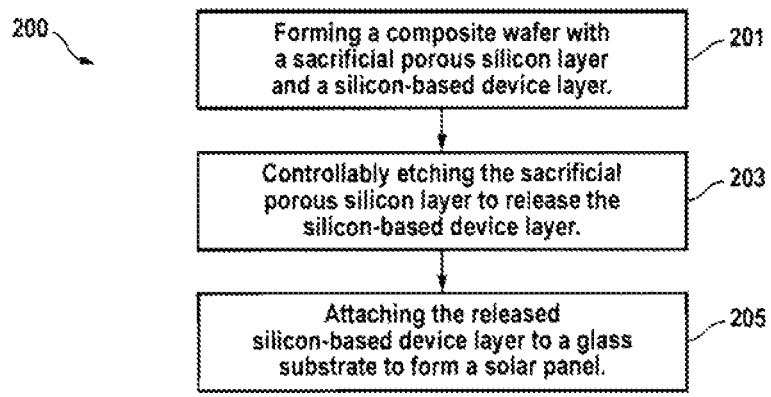
FIG. 2A shows a block-flow diagram outlining steps for making a solar cell, in accordance with the method of the invention.

FIG. 2A shows a block flow diagram 200 outlining steps for making a solar cell. In the step 201 a composite wafer 100 is formed, such as described with reference to FIG. 1A. After the composite wafer 100 is formed in the step 201, in the step 203 the sacrificial porous silicon layer 103 is controllably or selectively etched to form a released silicon-based device layer 105' and a released single crystal silicon wafer 101', such as shown in FIG. 1B.

Figure 2B:
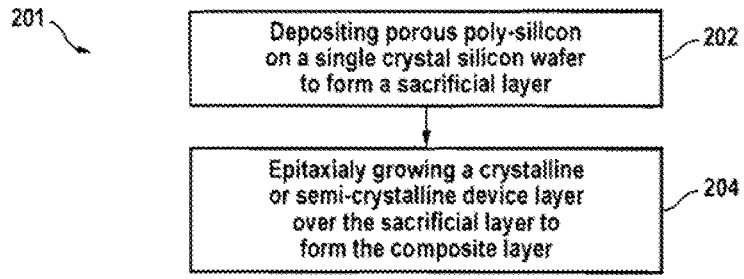
FIG. 2B shows a block-flow diagram outlining steps for making a composite wafer, in accordance with the method of the invention.

Referring to FIG. 2B, the composite wafer 100 is formed using any number of techniques or combination of techniques. For example, the sacrificial porous silicon layer 103 is deposited in the step 202 by spin coating poly-silicon on the substrate 101, which is preferably a single crystal silicon wafer. The poly-silicon is then dried or cured to remove solvent and form the sacrificial porous silicon layer 103. As described above, the sacrificial porous silicon layer 103 has a porosity of 30% or more, which is believed to increase the selectivity of the etch rate for the sacrificial porous silicon layer 103.

After the sacrificial porous silicon layer 103 is formed in the step 202, in the step 204 the device layer 105 is formed over the sacrificial porous silicon layer 103. The device layer 105 is preferably formed using any suitable technique, but is preferably formed by epitaxially growing a crystalline or semi-crystalline silicon device layer using vapor deposition techniques. The device layer 105 that is formed in the step 204 is preferably a p-doped device layer. The device layer 105 is formed, for example, by vapour depositing silicon-based precursors that includes a p-dopant or p-dopants, herein referred to as p-doped silicon-based precursors. Suitable p-doped silicon-based precursors include trivalent atoms typically from group IIIA of the periodic table, such as boron or aluminum. Alternatively to using p-doped silicon-based precursors to form the device layer 105, the device layer 105 may be doped after its formation using ion implantation techniques. In some cases, it can be useful to form the device layer 105 by using p-doped silicon-based precursors, such as described above, and further doping the device layer 105 with the same or different dopants using ion implantation techniques.

Figure 2C:
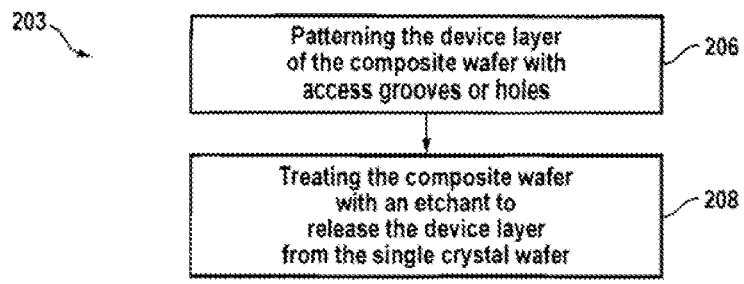
FIG. 2C shows a block-flow diagram outlining steps for releasing a device layer from the composite wafer, in accordance with the method of the invention.

Now referring to FIG. 2C, in step 203 the sacrificial porous silicon layer 103 is controllably or selectively etched to form a released silicon-based device layer 105' and a released single crystal silicon wafer 101'. In accordance with the embodiments of the invention, the sacrificial porous silicon layer 103 is controllably or selectively etched by first patterning the device layer 105 with access groove or holes in the step 206. After the device layer 105 is patterned with access grooves or holes in the step 206, the composite wafer 100 is treated with an etchant, such as described above and below. Patterning the device layer 105 with access grooves or holes prior to treating the composite wafer 100 with an etchant can result in faster etch rates by allowing a greater surface area of the sacrificial poly-silicon layer 103 to be initially exposed to the etchant.

In accordance with the embodiments of the invention, the device layer 105 is patterned with access groves or holes in the step 206 by using photo-resist masking and etching techniques. It will be clear to one skilled in the art that while patterning the device layer 105 with access groves or holes, such as described above, can be beneficial, it is not necessary to implement the present invention. Regardless of whether the step 206 of patterning the device layer 105 with access groves or holes is performed, in the step 208 the composite wafer 100 is treated with an etchant to form a released silicon-based device layer 105' and a release single crystal silicon wafer 101', such as shown in FIG. 1B.

Still referring to FIG. 2C, in the step 208 the composite wafer 100 is treated with an aqueous etchant comprising one or more of potassium hydroxide, sodium hydroxide and hydrogen fluoride in concentrations of 5% or less by weight. Preferably, the aqueous etchant is maintained at temperatures in a range of 0 to 10 degrees Celsius during the step 208. This temperature range results in better selectivity during the etching process. In further embodiments of the invention the aqueous etchant includes an alcohol, such as isopropyl alcohol, in a concentration of 10% or less by weight. In still further embodiments of the invention, the etchant includes a surfactant in a concentration of 1% or less by weight. Suitable surfactants include, but are not limited to:

1) Anionic Surfactants, such as, for example, Perfluorooctanoate (PFOA or PFO), Perfluorooctanesulfonate (PFOS), Sodium dodecyl sulfate (SDS), ammonium lauryl sulfate, Sodium laureth sulfate and Alkyl benzene sulfonate;
2) Soap or fatty acid salt surfactants;
3) Cationic Surfactants, such as, for example, Cetyl trimethylammonium bromide (CTAB), a.k.a. hexadecyl trimethyl ammonium bromide, Cetylpyridinium chloride (CPC), Polyethoxylated tallow amine (POEA), Benzalkonium chloride (BAC) and Benzethonium chloride (BZT);
4) Zwitterionic (amphoteric) Surfactants, such as, for example Dodecyl betaine, Cocamidopropyl betaine, Coco ampho glycinate; and
5) Nonionic Surfactants, such as, for example Alkyl poly (ethylene oxide), Alkylphenol poly(ethylene oxide) Copolymers of poly(ethylene oxide) and poly(propylene oxide), Octyl glucoside, Decyl maltoside, Fatty alcohols, Cetyl alcohol, Oleyl alcohol, Cocamide MEA, cocamide DEA, Polysorbates and Dodecyl dimethylamine oxide.

In still further embodiments of the invention, during the selective etching step 208 the composite wafer 100 and the aqueous etchant are treated with ultrasonic energy. After the release, silicon-based device layer 105' is formed in the step 203. In the step 205 the released silicon-based device layer 105' is attached to a suitable substrate 101", such as, for example, a glass substrate, and provided with all the appropriate inter-connects to form a solar cell.

Figure 3:
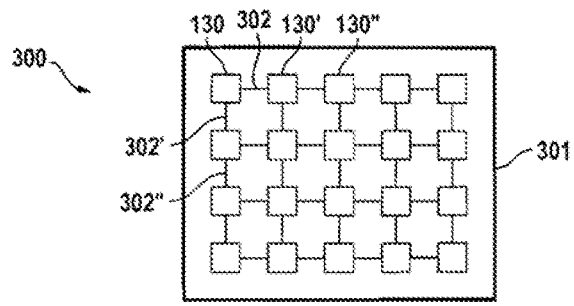
FIG. 3 shows a schematic representation of a solar panel with multiple solar cells on a common substrate, in accordance with the embodiments of the invention.

Referring now to FIG. 3, in further embodiments of the invention, a solar panel 300 is formed by attaching multiple solar cells 130, 130' and 130", such as the solar cell described above, to a common substrate 301. The solar cells 130, 130' and 130" are provided with all of the appropriate inter-connects 302, 302' and 302" to each other and/or the substrate 301 to allow the solar panel 300 to collect solar energy and provide power to a device 401 such as described below.

Figure 4:
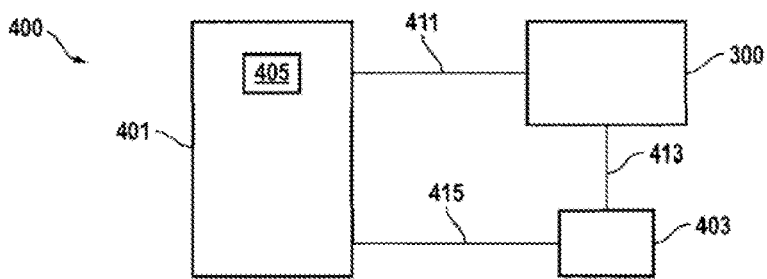
FIG. 4 shows a schematic representation of a system that utilizes a solar cell or panel, in accordance with the embodiments of the invention.

With reference to FIG. 4, a system 400 includes a solar panel 300, such as described above with reference to FIG. 3. The solar panel 300 is electrically coupled to a battery or energy storage device 403 through an electrical connection 413. The solar panel 300 and the battery or energy storage device 403 are electrically coupled to a device 401 through electrical connections 411 and 415, respectively. The device 401 is configured with the appropriate circuitry, such that the solar panel 300 and the battery or energy storage device is capable of powering the device 401. The device 401 may be computer, a hand-held communication device or any other electronic device now known or later developed. In accordance with the embodiments of the invention, the solar panel 300 and battery energy storage device 403 are built into the device 401 and the device 401 includes a display unit, screen or user interface 405.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A method of selectively etching a silicon wafer, the method comprising:
a) providing a sacrificial porous silicon layer on a single crystal silicon wafer; and
b) selectively etching the sacrificial porous silicon layer with an aqueous etchant;
wherein the aqueous etchant is maintained at a temperature in a range of 0° C. to 10° C. during step b) and the aqueous etchant comprises one or more of potassium hydroxide, sodium hydroxide and hydrogen fluoride in a concentration ranging from a non-zero amount up to 5 wt. % based on the total weight of the aqueous etchant.

2. The method of claim 1, wherein the aqueous etchant further comprises a surfactant.

3. The method of claim 2, wherein the surfactant is selected from the group consisting of anionic surfactants, fatty acid surfactants, cationic surfactants, zwitterionic surfactants, and non-ionic surfactants.

4. The method of claim 1, wherein the aqueous etchant comprises 1% or less by weight of the surfactant.

5. The method of claim 1, wherein the aqueous etchant further comprises an alcohol.

6. The method of claim 5, wherein the alcohol is isopropyl alcohol.

7. The method of claim 1 further comprising subsequent to step a) and prior to step b), forming a crystalline silicon device layer on the sacrificial porous silicon layer.

8. The method of claim 7, wherein the crystalline silicon device layer is patterned with access grooves or holes.

9. The method of claim 8, wherein the aqueous etchant contacts the sacrificial porous silicon layer via the access grooves or holes in the crystalline silicon device layer.

10. The method of claim 1, wherein the sacrificial porous silicon layer comprises a material selected from the group consisting of a carbon doped oxide, a spin-on-glass (SOG) and fluoridated silicon glass (FSG).

11. The method of claim 7, wherein the crystalline silicon layer is a p-doped crystalline silicon layer.

12. A method of selectively etching a silicon wafer, the method comprising:
a) providing a sacrificial porous silicon layer on a single crystal silicon wafer; and
b) selectively etching the sacrificial porous silicon layer with an aqueous etchant, the aqueous etchant comprising:
isopropyl alcohol in a concentration ranging from a non-zero amount up to 10 wt. % based on the total weight of the aqueous etchant; and
one or more of potassium hydroxide, sodium hydroxide, and hydrogen fluoride in a concentration ranging from a non-zero amount up to 5 wt. % based on the total weight of the aqueous etchant;
wherein during step b), the aqueous etchant is maintained at a temperature in a range of 0° C. to 10° C.

* * * * *